(12) United States Patent
Kawaguchi et al.

(10) Patent No.: US 7,294,439 B2
(45) Date of Patent: Nov. 13, 2007

(54) COLOR-CONVERTING FILTER AND MANUFACTURING METHOD

(75) Inventors: Koji Kawaguchi, Nagano (JP); Makoto Kobayashi, Nagano (JP); Toshio Hama, Nagano (JP); Kenya Sakurai, Nagano (JP)

(73) Assignee: Fuji Electric Holdings Co., Ltd. (KP)

( * ) Notice: Subject to any disclaimer, the term of this patent is extended or adjusted under 35 U.S.C. 154(b) by 332 days.

(21) Appl. No.: 10/930,453

(22) Filed: Aug. 31, 2004

(65) Prior Publication Data

US 2005/0089772 A1    Apr. 28, 2005

Related U.S. Application Data

(63) Continuation-in-part of application No. 10/795,794, filed on Mar. 8, 2004, now Pat. No. 6,881,525.

(30) Foreign Application Priority Data

Apr. 1, 2003 (JP) .............................. 2003-098553
Apr. 1, 2004 (JP) .............................. 2004-109402

(51) Int. Cl.
*G02F 1/23* (2006.01)
*G02B 5/20* (2006.01)

(52) U.S. Cl. .......................................... 430/7; 430/339

(58) Field of Classification Search ...................... None
See application file for complete search history.

(56) References Cited

U.S. PATENT DOCUMENTS

2001/0043043 A1* 11/2001 Aoyama et al. ............ 313/506
2002/0071071 A1   6/2002 Sekiguchi et al.
2003/0222576 A1* 12/2003 Lu .............................. 313/504
2004/0051781 A1   3/2004 Kawaguchi et al.

FOREIGN PATENT DOCUMENTS

| GB | 2 357 179 A | 6/2001 |
|---|---|---|
| GB | 2 357 180 A | 6/2001 |
| GB | 2 357 889 A | 7/2001 |
| JP | 63-111795 U | 7/1988 |
| JP | 9-204982 A | 8/1997 |
| JP | 11-202118 A | 7/1999 |
| JP | 11-279426 A | 10/1999 |
| JP | 2000-012217 A | 1/2000 |
| JP | 2000-44824 A | 2/2000 |
| JP | 2001-164245 A | 6/2001 |
| JP | 2002-231450 A | 8/2002 |
| JP | 2003-229261 A | 8/2004 |

* cited by examiner

*Primary Examiner*—John A. McPherson
(74) *Attorney, Agent, or Firm*—Rossi, Kimms & McDowell LLP (57) ABSTRACT

A color-converting-function-possessing color filter and a method for its manufacture are disclosed. A simplified manufacturing process is provided that makes possible highly detailed patterning. The method of manufacturing the color-converting filter comprises a step of forming color filter layers on a transparent substrate, a step of forming a colorant layer containing a color-converting colorant on the color filter layers, and a step of exposing the colorant layer via the transparent substrate and the color filter layers using colorant-decomposing light, thus forming color-converting layers in positions corresponding to the color filter layers. In usage, a layered body consists of a transparent substrate, color filter layers and a colorant layer as a color-converting-function-possessing filter.

6 Claims, 4 Drawing Sheets

COLOR-CONVERTING FILTER AND MANUFACTURING METHOD

CROSS REFERENCE TO RELATED APPLICATIONS

This application claims priority from Japanese application Serial No. JP 2004-109402, filed on Apr. 1, 2004, and the contents of this document are incorporated herein by reference in their entirety. This application is a continuation-in-part of U.S. application Ser. No. 10/795,794 filed Mar. 8, 2004, now U.S. Pat. No. 6,881,525 and the contents of this document also are incorporated herein by reference in their entirety.

BACKGROUND OF THE INVENTION

A. Field of the Invention

The present invention relates to a method of manufacturing a color-converting filter that enables multi-color display. The color-converting filter can be used for display in image sensors, personal computers, word processors, televisions, facsimiles, audio equipment, video equipment, car navigation equipment, desk-top electronic calculators, telephones, mobile terminal equipment, industrial measuring equipment, and so on.

B. Description of the Related Art

In recent years, as one method of achieving multi-color or full-color display, studies have been carried out into a color conversion method in which color-converting colorants that absorb near ultraviolet light, blue light, blue/green light or white light, carry out wavelength distribution conversion and emit light in the visible region are used as filters (see Japanese Patent Application Laid-open Nos. 8-279394 and 8-286033.

In the case of using the color conversion method, the color of the light emitted by the light source is not limited to being white, and hence the degree of freedom of selection of the light source can be increased. For example, an organic EL light emitter that emits blue light can be used, and green and red light can be obtained through wavelength distribution conversion. The possibility has been investigated of constructing a full-color luminescent-type display for which a light source having improved efficiency can be used, including even a low-energy radiation such as near ultraviolet light or visible light (see Japanese Patent Application Laid-open No. 9-80434).

An important problem in terms of practical application to a color display is providing a color-converting filter that enables detailed color display, is stable in terms of color fidelity and so on over a prolonged period, and also has high color conversion efficiency. However, if the concentration of the color-converting colorants is increased to increase the color conversion efficiency, then a drop in the efficiency due to so-called concentration quenching, and decomposition of the color-converting colorants over time and so on will occur. Hence the current state of affairs is that the desired color conversion efficiency is obtained by increasing the thickness of the color-converting layers containing the color-converting colorants. In order to prevent concentration quenching and decomposition of color-converting colorants, introduction of a bulky substituent onto the colorant nucleus has been studied (see Japanese Patent Application Laid-open Nos. 11-279426, 2000-44824 and 2001-164245. Addition of a quencher has been studied as a means of preventing decomposition of color-converting colorants (see Patent Japanese Patent Application Laid-open No. 2002-231450).

Other documents that relate to color-converting filters include Japanese Patent Application Laid-open Nos. 5-134112, 7-218717, 7-306311, 5-119306, 7-104114, 7-48424, 6-300910, 7-128519, 9-330793, 8-27934, and 5-36475 and *Gekkan Display*, 1997, Vol. 3, No. 7.

To increase the level of detail of a multi-color or full-color display that uses the color conversion method, it is necessary to carry out highly detailed patterning of the color-converting layers. However, when the width of each line in the pattern is smaller than the film thickness of the color-converting layers, the reproducibility of the pattern shape and deformation of the pattern during subsequent manufacturing steps become problems. In addition, when the patterning is carried out using ordinary photolithography, an application step, an exposure step carried out while aligning the mask, and a developing step are required for each color of the color-converting layers. For example, when a full-color display is to be obtained, at least red, green and blue color-converting layers are required, and hence the manufacturing process requires many steps, and is complex.

The present invention is directed to overcoming or at least reducing the effects of one or more of the problems set forth above.

SUMMARY OF THE INVENTION

It is thus an object of the present invention to provide a simplified method of manufacturing a color-converting filter which still allows for highly detailed patterning.

A method of manufacturing a color-converting filter according to a first embodiment of the present invention is characterized by comprising a step of forming color filter layers on a transparent substrate, a step of forming a colorant layer containing a color-converting colorant on the color filter layers, and a step of exposing the colorant layer via the transparent substrate and the color filter layers using colorant-decomposing light, thus forming color-converting layers in positions corresponding to the color filter layers, wherein the color-converting colorant is decomposed by light outside a wavelength region transmitted by the color filter layers, the colorant-decomposing light contains a wavelength component that decomposes the color-converting colorant, and the color-converting layers emit, through wavelength distribution conversion, light that will be transmitted by the color filter layers.

A method of manufacturing a color-converting filter according to a second embodiment of the present invention is characterized by comprising a step of forming color filter layers of n types on a transparent substrate, a step of forming a colorant layer containing color-converting colorants of n−1 types on the color filter layers of the n types, and a step of exposing the colorant layer via the transparent substrate and the color filter layers using colorant-decomposing light, thus forming color-converting layers of an $m^{th}$ type in positions corresponding to the color filter layers of the $m^{th}$ type, wherein n represents an integer from 2 to 6, and m takes on the values of all integers from 1 to n−1, each of the n types of the color filter layers transmits light in a different wavelength region, the $m^{th}$ type of the color-converting colorants is decomposed by light not transmitted by the color filter layers of the $m^{th}$ type, and the color-converting layers of the $m^{th}$ type emit, through wavelength distribution conversion, light that will be transmitted by the color filter layers of the $n^{th}$ type. In this embodiment, the colorant layer may further contain an $n^{th}$ type of color-converting colorant, color-converting layers of the $n^{th}$ type may be formed through the exposure in positions corresponding to the color filter layers of the $n^{th}$ type, the $n^{th}$ type of the color-converting colorants may be decomposed by light not transmitted by the color filter layers of the $n^{th}$ type, and the $n^{th}$ type of the color-converting colorants may emit, through wavelength distribution conversion, light that will be transmitted by the color filter layers of the $n^{th}$ type.

A color-converting-function-possessing color filter according to a third embodiment of the present invention is characterized by comprising a transparent substrate, color filter layers of n types (wherein n represents an integer from 2 to 6) formed on the transparent substrate, and a colorant layer containing at least one color-converting colorant formed integrally with and covering the color filter layers of the n types, wherein the at least one color-converting colorant absorbs light in part of the wavelength region of incident light, and emits light in a wavelength region different to the wavelength region of absorption.

In a preferred embodiment, the colorant layer also functions as a protective layer for said color filter layers. In another embodiment, incident light incident on said colorant layer is blue to blue/green light, and the at least one color-converting colorant emits red light. In a further embodiment, the light exiting said colorant layer is white light. In yet another embodiment, in the colorant layer, the at least one color-converting colorant is dispersed in a resin. The filter may additionally comprise a gas barrier layer covering the colorant layer.

As described above, according to the manufacturing method of the first or second embodiment of the present invention, highly detailed color-converting layers can be formed through self-alignment using color filter layers as masks. According to the present invention, the necessity of carrying out patterning of the color-converting layers through photolithography is eliminated, and hence the manufacturing process can be shortened. Furthermore, color-converting layers having increased thickness are formed integrally with a flattening layer, and hence even if color-converting layers having a width that is narrow compared with the thickness are formed, misshaping and so on of the color-converting layers can be suppressed. According to the method of the present invention, a color-converting filter that can be used in a microdisplay (e.g. a video camera viewfinder) can thus be manufactured.

Moreover, the color-converting-function-possessing color filter of the third embodiment of the present invention has special advantages as a color filter for display. With this embodiment, for light emitted by independently controllable light sources in positions corresponding to sub-pixels provided in a matrix shape, the hue is changed by the colorant layer to produce white light, which enters the color filter layers of the sub-pixels. Consequently, unlike the case where color-converting layers are provided corresponding to the colors of the respective sub-pixels, identical light enters each of the color filter layers of the various colors, and hence the necessity of considering the efficiency of color conversion for the color-converting layers of each of the colors when driving the light sources is eliminated, and thus the driving circuitry for the light sources can be simplified and hence the cost can be reduced. Furthermore, since each of the light sources arranged in the matrix shape can be driven under identical conditions, the problem of only light sources corresponding to a particular color deteriorating upon prolonged driving can be suppressed, and hence the color tone of the display can be maintained for a prolonged period.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1A:
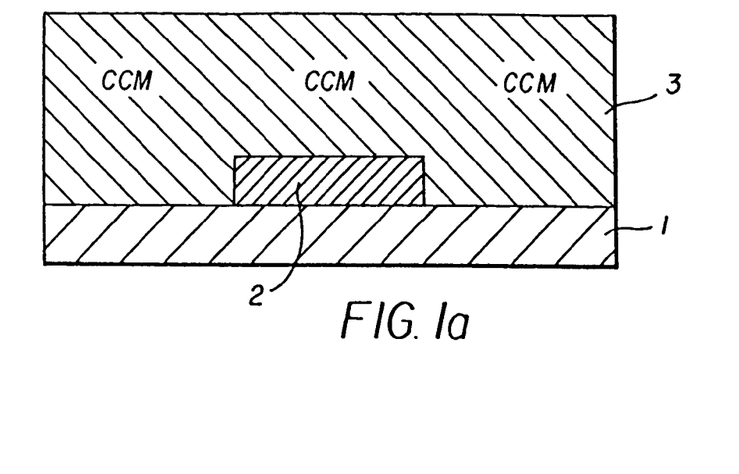
FIGS. 1(a) to 1(c) are schematic drawings showing a method of manufacturing a color-converting filter according to a first embodiment of the present invention.
Figure 1B:
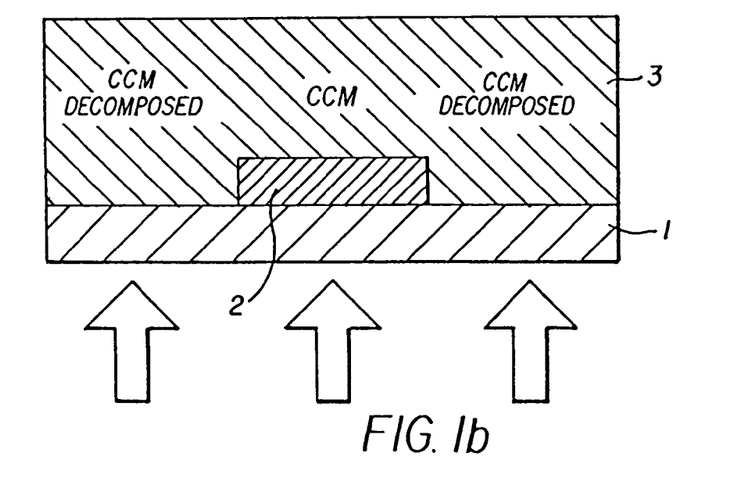
Figure 1C:
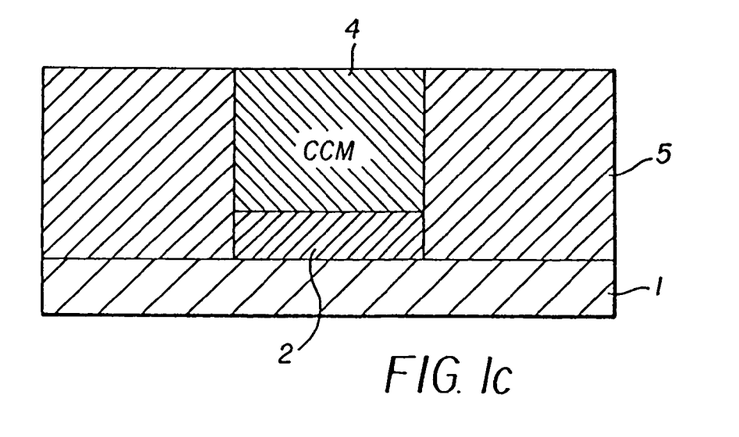

FIGS. 1(a) to 1(c) show a first embodiment of a method of manufacturing a color-converting filter according to the present invention. FIGS. 1(a) shows a laminate in which color filter layers 2, and colorant layer 3 containing a color-converting colorant (CCM) have been provided on a transparent substrate 1.

The transparent substrate 1 must be transparent to visible light (wavelength 400 to 700 nm), and preferably to light that has been subjected to conversion by color-converting layers 4. Moreover, transparent substrate 1 should be able to withstand the conditions (solvents, temperature etc.) used when forming color-converting layers 4 and other layers that are provided as required (described later), and preferably has excellent dimensional stability. Preferable materials for transparent substrate 1 include glasses, and resins such as polyethylene terephthalate and polymethylmethacrylate. A borosilicate glass, a blue plate glass or the like is particularly preferable.

Color filter layers 2 are layers that transmit only light in a desired wavelength region. In the completed color-converting filter, color filter layers 2 are effective in blocking light from a light source that has not been subjected to wavelength distribution conversion by color-converting layers 4, and moreover in improving the color purity of the light that has been subjected to wavelength distribution conversion by color-converting layers 4. In addition, color filter layers 2 in the present embodiment function as a mask during patterning of colorant layer 3 to form color-converting layers 4 in step (b) described below. The color filter layers 2 contain a colorant and a photosensitive resin. It is preferable to use a pigment having high light-fastness as the colorant. Photosensitive resins include, for example, (1) compositions comprising an acrylic polyfunctional monomer or oligomer having a plurality of acryloyl groups or methacryloyl groups and a photopolymerization initiator, (2) compositions comprising a polyvinyl cinnamic acid ester and a sensitizer, and (3) compositions comprising a chain or cyclic olefin and a bisazide (a nitrene is generated, and the olefin is crosslinked). The color filter layers may also be formed, for example, using a commercially available color filter material for liquid crystals (e.g., a Color Mosaic made by Fujifilm Arch Co., Ltd.).

Color filter layers 2 have a thickness of about 1 to 2.5 µm, preferably about 1 to 1.5 µm, although this depends on the colorant content. By controlling thickness within this range, highly detailed patterning becomes possible, and it is possible to obtain a transmission spectrum such that color filter layers 2 function sufficiently as both a mask in step (b) and a filter in the completed color-converting filter.

Colorant layer 3 is a layer that comprises a color-converting colorant and a matrix resin. The color-converting colorant is a colorant that subjects incident light to wavelength distribution conversion and emits light in a wavelength region transmitted by color filter layers 2, and is preferably a colorant that subjects near ultraviolet light or blue to blue/green light to wavelength distribution conversion and emits light in a wavelength region transmitted by color filter layers 2 (e.g., blue, green or red). If desired, the color-converting colorant may also carry out wavelength distribution conversion within the range of the wavelength region transmitted by color filter layers 2. Moreover, the color-converting colorant is selected from colorants that are decomposed by light transmitted by transparent substrate 1, but are not decomposed by light transmitted by color filter layers 2. Here, it is important that colored decomposition products are not produced when the colorant is decomposed by light transmitted by transparent substrate 1. In particular, a strong requirement is that there be no absorption in the wavelength region obtained through the wavelength distribution conversion. The reason for this is that if there is absorption of light in this wavelength region, then there will be a drop in the light conversion efficiency. Moreover, even if there is no absorption of light in this wavelength region, colored decomposition products will cause unwanted coloration of the color-converting filter obtained, and are thus undesirable.

Color-converting colorants that absorb light in the blue to blue/green region and emit red light include, for example, rhodamine type colorants such as Rhodamine B, Rhodamine 6G, Rhodamine 3B, Rhodamine 101, Rhodamine 110, sulforhodamines, Basic Violet 11 and Basic Red 2, cyanine type colorants, pyridine type colorants such as 1-ethyl-2[4-(p-dimethylaminophenyl)-1,3-butadienyl]-pyridinium perchlorate (Pyridine 1), and oxazine type colorants.

Color-converting colorants that absorb light in the blue to blue/green region and emit green light include, for example, coumarin type colorants such as 3-(2'-benzothiazolyl)-7-diethylaminocoumarin (Coumarin 6), 3-(2'-benzoimidazolyl)-7-diethylaminocoumarin (Coumarin 7), 3-(2'-N-methylbenzoimidazolyl)-7-diethylaminocoumarin (Coumarin 30) and 2,3,5,6-1H,4H-tetrahydro-8-trifluoromethylquinolizino-(9,9a, 1-gh)coumarin (Coumarin 153), and Basic Yellow 51, which is a coumarin colorant type dye, and also naphthalimide type colorants such as Solvent Yellow 11 and Solvent Yellow 116.

Examples of fluorescent colorants that absorb light in the near ultraviolet or visible region and emit blue light include coumarin type colorants such as Coumarin 466, Coumarin 47, Coumarin 2 and Coumarin 102.

Other than the above-mentioned colorants, any of various dyes (direct dyes, acid dyes, basic dyes, disperse dyes, etc.) can be used, provided that (1) the dye can carry out the desired wavelength distribution conversion, (2) the dye is decomposed by light transmitted by transparent substrate 1, but is not decomposed by light transmitted by color filter layers 2, and (3) colored decomposition products are not produced when the dye is decomposed by light.

Matrix resins that can be used in the colorant layer 3 include ones obtained by curing the photosensitive resin used in the color filter layers described earlier, and also thermoplastic resins such as polycarbonates, polyesters (polyethylene terephthalate etc.), polyethersulfones, polyvinyl butyral, polyphenylene ethers, polyamides, polyether imides, norbornene resins, methacrylic resins, isobutylene-maleic anhydride copolymer resins, cyclic olefin resins, polyvinyl chloride, vinyl chloride-vinyl acetate copolymer resins, alkyd resins and aromatic sulfonamide resins, thermosetting resins such as epoxy resins, phenol resins, urethane resins, acrylic resins, vinyl ester resins, imido resins, urea resins and melamine resins, and polymer hybrids comprising polystyrene, polyacrylonitrile, a polycarbonate or the like, and a trifunctional or tetrafunctional alkoxysilane. A mixture of such resins may also be used as the matrix resin.

In the present invention, it is preferable to use at least about 0.2 µmol, more preferably about 1 to 20 µmol, yet more preferably about 3 to 15 µmol, of the color-converting colorant per 1 g of the matrix resin used. Moreover, colorant layer 3 has (i.e., color-converting layers 4 and flattening layer 5 have) a thickness of at least about 5 µm, preferably about 7 to 15 µm. As a result, color-converted output light of a desired intensity can be obtained. Furthermore, if desired, colorant layer 3 may contain a plurality of colorants.

In an exposure step of FIG. 1(b), exposure with light is carried out from the transparent substrate side such that the light passes through color filter layers 2 and reaches colorant layer 3. The light used in the exposure contains a wavelength component that decomposes the colorant contained in colorant layer 3 but is absorbed by color filter layers 2. For example, in the case of manufacturing red color-converting layers 4, color filter layers 2 are red, and light containing a wavelength component below 600 nm is used in the exposure. Similarly, in the case of manufacturing green color-converting layers 4, color filter layers 2 are green, and light containing a wavelength component below 500 nm is used in the exposure. Furthermore, in the case of manufacturing blue color-converting layers 4, color filter layers 2 are blue, and light or near ultraviolet radiation containing a wavelength component below 400 nm is used in the exposure. In each of the cases, the exposure may also be carried out using white light containing the above-mentioned wavelength component.

The light used in the exposure should have an intensity considerably higher than the intensity of the light to be used in the wavelength distribution conversion carried out by the formed color-converting filter; it is preferable to use light having an intensity of at least about 0.05 W/cm$^2$, more preferably at least about 1 W/cm$^2$, at the surface of transparent substrate 1 on which the light is incident, although this will depend on the color-converting colorant used and so on. The exposure time will depend on the desired extent of decomposition of the color-converting colorant, and is a matter that can be determined as appropriate by a person skilled in the art. By using light having a high intensity in this way, the color-converting colorant can be decomposed in the desired regions.

As the light source, any light source known in the technical field in question may be used, for example a halogen lamp, a metal halide lamp, an incandescent lamp, an electric discharge lamp, a mercury lamp, or a laser; however, a light source that satisfies the wavelength requirements described above should be selected.

When the exposure described above is carried out, decomposition of the color-converting colorant does not occur in the region above each of color filter layers 2, but does occur in regions where no color filter layer 2 is provided. As a result, as shown in FIG. 1(c), color-converting layer 4 is formed above each of color filter layers 2, and colorless flattening layer 5 not containing the color-converting colorant is formed in the regions where no color filter layer 2 is provided. Note that in the present embodiment, color-converting layers 4 have the same composition as the originally formed colorant layer 3.

A method of manufacturing a color-converting filter according to a second embodiment of the present invention is characterized by comprising a step of forming color filter layers of n types on a transparent substrate, a step of forming a colorant layer containing color-converting colorants of n−1 types on the color filter layers of the n types, and a step of exposing the colorant layer via the transparent substrate and the color filter layers using colorant-decomposing light, thus forming color-converting layers of an $m^{th}$ type in positions corresponding to the color filter layers of the $m^{th}$ type, wherein n represents an integer from 2 to 6, and m takes on the values of all integers from 1 to n−1; each of the n types of color filter layers transmits light in a different wavelength region, the $m^{th}$ type of the color-converting colorants is decomposed by light not transmitted by the color filter layer of the $m^{th}$ type, and the color-converting layers of the $m^{th}$ type emit, through wavelength distribution conversion, light that will be transmitted by the color filter layers of the $m^{th}$ type. The case for n=3 is shown in FIGS. 2(*a*) to 2(*c*).

Figure 2A:
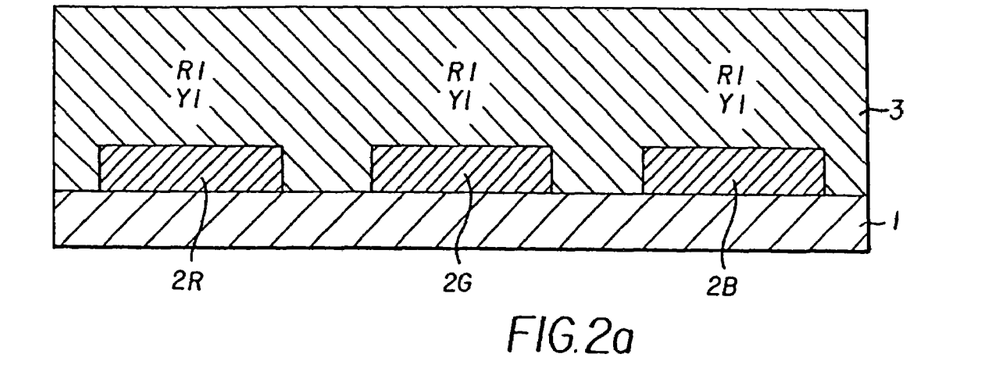
FIGS. 2(a) to 2(c) are schematic drawings showing a method of manufacturing a color-converting filter according to a second embodiment of the present invention.

FIG. 2(*a*) shows a laminate in which first (red) color filter layers 2R, second (green) color filter layers 2G, third (blue) color filter layers 2B, and colorant layer 3 containing a first color-converting colorant R1 and a second color-converting colorant Y1 are provided on transparent substrate 1.

The first color-converting colorant R1 is a colorant that emits red light through wavelength distribution conversion, preferably a colorant that subjects near ultraviolet light or blue to blue/green light to wavelength distribution conversion and emits red light (within a wavelength range of 600 to 700 nm). Moreover, the first color-converting colorant R1 is decomposed by light containing a wavelength component below 600 nm. The second color-converting colorant Y1 is a colorant that emits green light (within a wavelength range of 500 to 600 nm) through wavelength distribution conversion, preferably a colorant that subjects near ultraviolet light or blue to blue/green light to wavelength distribution conversion and emits green light. Moreover, the second color-converting colorant Y1 is decomposed by light containing a wavelength component below 500 nm. The various constituent elements of the laminate of the present embodiment, including the color-converting colorants, can be formed using materials as described in the first embodiment.

Figure 2B:
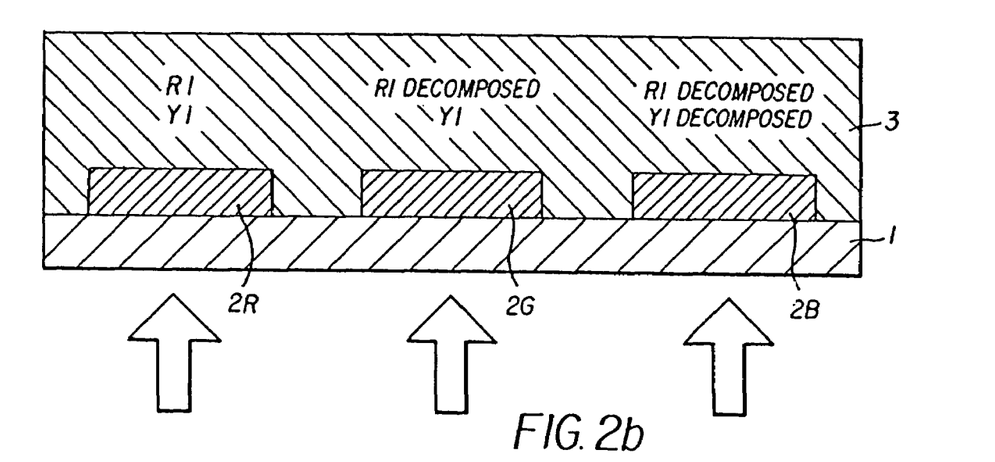
Figure 2C:
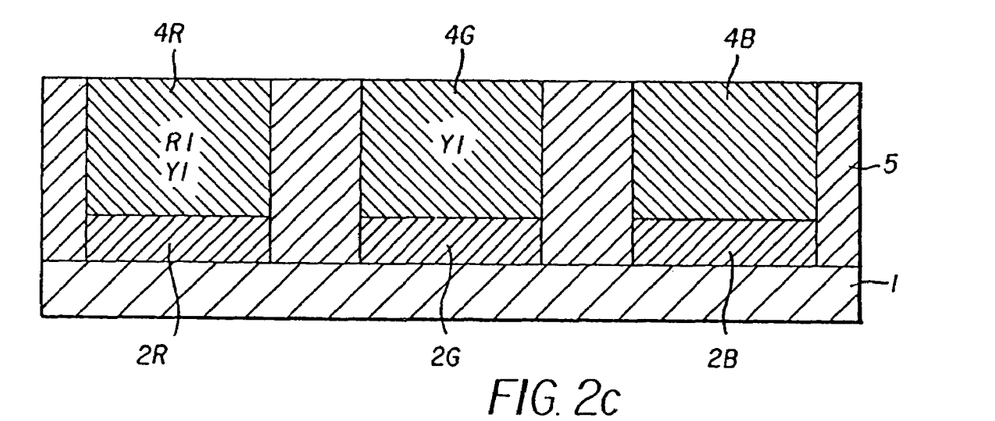

FIG. 2(*b*) shows an exposure step in which exposure with light is carried out via transparent substrate 1 and color filter layers 2 of the plurality of types. The light used in the exposure contains at least components that together decompose the red color-converting colorant R1 and the green color-converting colorant Y1, specifically a wavelength component of 500 to 600 nm, and a wavelength component below 500 nm. The exposure may also be carried out using white light containing these wavelength components.

During the exposure, the red color filter layers 2R do not transmit wavelength components below 600 nm, and hence neither the red color-converting colorant R1 nor the green color-converting colorant Y1 is decomposed in parts of colorant layer 3 positioned above the red color filter layers 2R. Red color-converting layers 4R containing R1 and Y1 are thus formed above the red color filter layers 2R. In the present embodiment, the wavelength distribution conversion into red light in the red color-converting layers 4R may be carried out by the red color-converting colorant R1 only. Alternatively, green light emitted by the green color-converting colorant Y1 may be subjected to wavelength distribution conversion into red light by the red color-converting colorant R1.

Moreover, the green color filter layers 2G transmit the wavelength component of 500 to 600 nm, but do not transmit the wavelength component below 500 nm. Consequently, in parts of colorant layer 3 positioned above green color filter layers 2G, the red color-converting colorant R1 is decomposed by the wavelength component of 500 to 600 nm, but the green color-converting colorant Y1 is not decomposed. Green color-converting layers 4G containing Y1 are thus formed above the green color filter layers 2G. In the present embodiment, wavelength distribution conversion into green light in green color-converting layers 4G is carried out by only the green color-converting colorant Y1.

Furthermore, blue color filter layers 2B transmit a wavelength component below 400 to 500 nm. Consequently, in the parts of colorant layer 3 positioned above blue color filter layers 2B, the red color-converting colorant R1 and the green color-converting colorant Y1 are both decomposed by the wavelength component of 400 to 500 nm. In the example shown in FIGS. 2(*a*) to 2(*c*), layers 4B formed above blue color filter layers 2B contain no color-converting colorants.

The color-converting filter obtained through the exposure step described above is shown in FIG. 2(*c*). At parts where no color filter layer 2 is provided, the red color-converting colorant R1 and the green color-converting colorant Y1 are both decomposed by the wavelength component of 400 to 500 nm, and hence colorant layer 3 becomes flattening layer 5 containing no color-converting colorants. If blue or blue/green light is irradiated onto the color-converting filter from the side of color-converting layers 4, then red light produced through the wavelength distribution conversion in red color-converting layers 4R is emitted via red color filter layers 2R, and green light produced through the wavelength distribution conversion in green color-converting layers 4G is emitted via green color filter layers 2G. Moreover, blue light is emitted via blue color filter layers 2B.

In the present embodiment, the content of the color-converting colorant(s) in color-converting layers 4, and the thickness of color-converting layers 4, are as in the first embodiment. Moreover in the present embodiment, again each of color-converting layers 4 may contain a plurality of colorants.

In the present embodiment, colorant layer 3 may further contain a blue color-converting colorant B1 that emits blue light through wavelength distribution conversion of ultraviolet radiation or visible light. As the blue color-converting colorant B1, it is preferable to use a colorant that is decomposed by light or near ultraviolet radiation containing a wavelength component below 400 nm.

In the exposure step of FIG. 2(*b*), the blue color-converting colorant B1 is not decomposed in the parts of colorant layer 3 where color filter layers 2R, 2G and 2B are provided. Blue color-converting layers 4B thus come to contain the blue color-converting colorant B1. Moreover, color-converting layers 4R and 4G also come to further contain the blue color-converting colorant B1. In this case, the red color-converting colorant R1 and/or the green color-converting colorant Y1 may further subject the blue light emitted by the blue color-converting colorant B1 to wavelength distribution conversion. Furthermore, in the case that the light emitted by the light source used in the exposure contains a wavelength component below 400 nm, the blue color-converting colorant B1 will be decomposed in parts of colorant layer 3 where no color filter layer 2 is provided, and hence flattening layer 5 will come to contain no color-converting colorants. In the case that the light emitted by the light source does not contain a wavelength component below 400 nm, flattening layer 5 will come to contain the blue color-converting colorant B1.

Figure 3A:
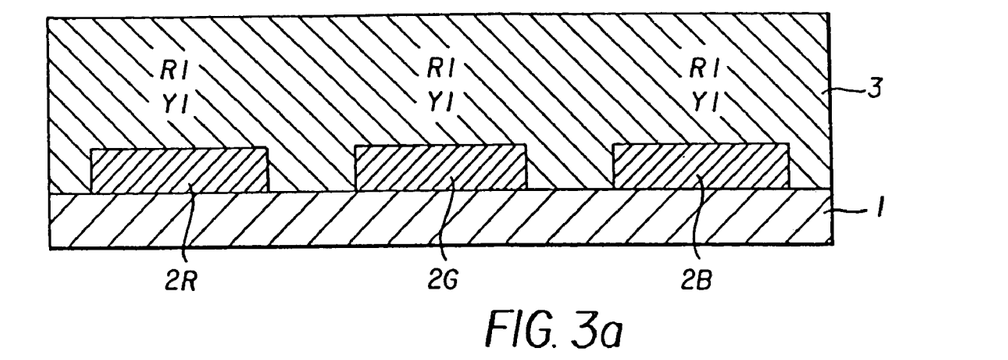
FIGS. 3(a) to (d) are schematic drawings showing a variation of the method of manufacturing a color-converting filter according to the second embodiment of the present invention.
Figure 3B:
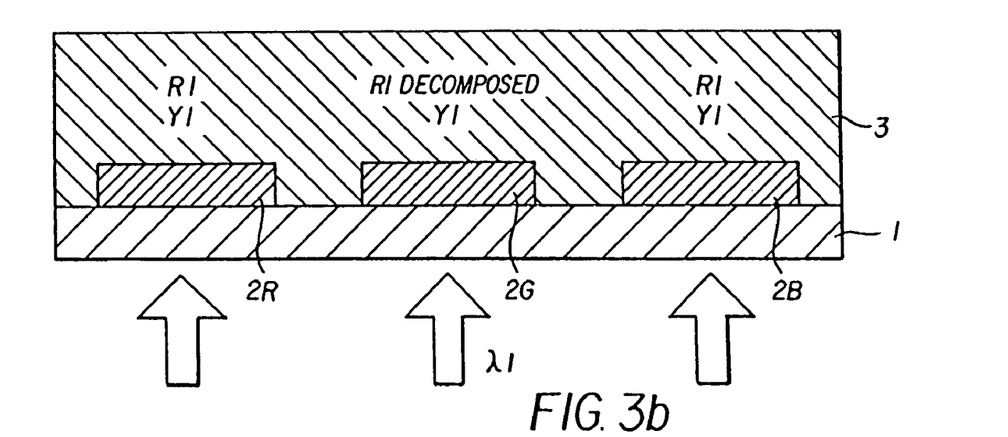

A variation of the present embodiment is shown in FIGS. 3(a) to (d). In FIGS. 3(a) to (d), the color-converting filter is formed using two exposure steps. The laminate shown in FIG. 3(a) is the same as that shown in FIG. 2(a). In a first exposure step shown in FIG. 3(b), light containing a wavelength component of 500 to 600 nm is used. This wavelength component is transmitted by green color filter layers 2G, and thus decomposes the red color-converting colorant R1 in the parts of colorant layer 3 positioned above green color filter layers 2G. On the other hand, red color filter layer 2R and blue color filter layer 2B do not transmit this wavelength component, and hence the red color-converting colorant R1 is not decomposed in the parts of colorant layer 3 positioned above red and blue color filter layers 2R and 2B.

Figure 3C:
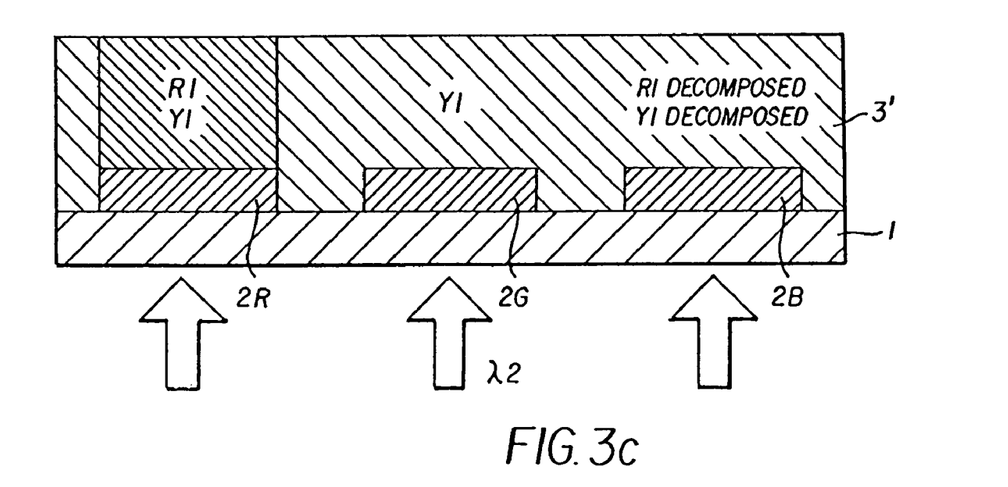

Next, in a second exposure step shown in FIG. 3(c), light containing a wavelength component of 400 to 500 nm is used. This wavelength component is transmitted by blue color filter layers 2B, and thus decomposes the red color-converting colorant R1 and the green color-converting colorant Y1 in the parts of colorant layer 3 positioned above blue color filter layers 2B. On the other hand, red color filter layer 2R and green color filter layer 2G do not transmit this wavelength component, and hence the red color-converting colorant R1 and the green color-converting colorant Y1 are not decomposed in the parts of colorant layer 3 positioned above red and green color filter layers 2R and 2G.

Figure 3D:
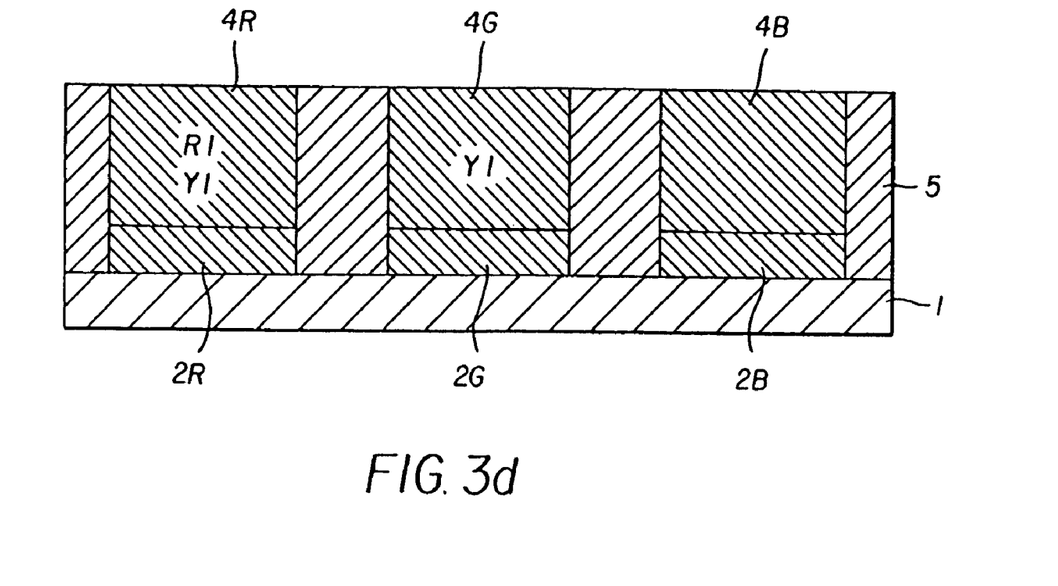

The color-converting filter shown in FIG. 3(d) obtained through the two exposure steps described above has the same structure as that shown in FIG. 2(c). In the present variation, the number of exposure steps is greater, but in each of the exposure steps, a light source having a narrower emission wavelength region and a higher intensity can be used. The time taken for each of the exposure steps can thus be shortened. Note that in the present variation, the order of the exposure steps is not fixed, but rather the exposure with the wavelength component of shorter wavelength may instead be carried out first.

Moreover, in the present variation, colorant layer 3 may further contain a blue color-converting colorant B1 that emits blue light through wavelength distribution conversion of ultraviolet radiation or visible light. In this case, blue color-converting layers 4B will come to contain the blue color-converting colorant B1.

As described above, according to the method of the present embodiment, a color-converting filter that gives the three colors red, green and blue necessary for full-color display can be obtained. By arranging a plurality of independently controllable light sources in positions corresponding to the positions of the color-converting layers, a multi-color display can thus be formed. Moreover, in the present embodiment, through self-alignment using as masks color filter layers 2 that are thin and can be formed to high detail, color-converting layers 4 can be formed in desired positions using a shorter manufacturing process. Furthermore, the matrix resin of color-converting layers 4 and flattening layer 5 constitutes a single integrated body, remaining as when formed as colorant layer 3, and hence even if color-converting layers 4 having a width that is narrow compared with the film thickness are formed, misshaping of color-converting layers 4 can be suppressed.

In the present embodiment, a the case of forming color-converting layers of the three colors red, green and blue has been described, but it should be understood that other colors may be used instead. Moreover, if desired, 2 types or 4 or more types, preferably 2 to 6 types, of color-converting layers may be formed. In the case of forming 6 types of color-converting layers, taking the first to sixth color filter layers to transmit light in first to sixth wavelength regions that are in order from the longest wavelength downwards, and taking the first to fifth color-converting colorants to emit light by wavelength distribution conversion of wavelengths that are in order from the longest wavelength downwards, it is preferable to arrange things such that the first color-converting colorant is decomposed by light in the second wavelength region, the second color-converting colorant is decomposed by light in the third wavelength region, and so on up to the fifth color-converting colorant being decomposed by light in the sixth wavelength region. In the case of the colorant layer further containing a sixth color-converting colorant, it is preferable to make it such that the sixth color-converting colorant is not decomposed by light in any of the first to sixth wavelength regions. The cases of forming two to five types of color-converting layers are analogous to the above.

In the case of forming a plurality of types of color-converting layers 4, a color-converting filter for so-called area color display may be formed in which color-converting layers different to those in other regions are formed only in certain regions. Alternatively, a color-converting filter for display may be formed by taking red, green and blue color-converting layers 4 having, for example, a rectangular or circular shape as one set, and providing this set repeatedly in a matrix shape, or taking red, green and blue color-converting layers 4 that each have a stripe shape and are parallel to one another as one set, and providing this set repeatedly over the transparent substrate. Here, color-converting layers of a particular color also can be disposed more (in terms of number or area) than the color-converting layers of the other colors. Alternatively, a plurality of color-converting layers may be arranged following a pattern, signs, characters, marks or the like, and these may be displayed. In another alternative, a single color that could not be achieved using a single type of color-converting layer 4 may be displayed by using two types of color-converting layers 4 arranged with a suitable area ratio therebetween divided into very small regions.

Furthermore, with the method of the present embodiment, a gas barrier layer covering colorant layer 3 may be provided. The material used for forming the gas barrier layer can be selected from materials that have high transparency in the visible region (a transmittance of at least about 50% in a range of 400 to 700 nm), Tg of at least about 100° C., and a surface hardness of at least pencil hardness 2H, and that do not cause deterioration in the functions of colorant layer 3 or color-converting layers 4 therebelow. Preferable materials for forming the gas barrier layer include inorganic oxides/nitrides such as $SiO_x$, $SiN_x$, $SiN_xO_y$, $AlO_x$, $TiO_x$, $TaO_x$ and $ZnO_x$.

Furthermore, in the case of providing a gas barrier layer with the method of the present invention, the gas barrier layer may be a single layer, or a multi-layered structure comprising a plurality of layers using a plurality of different materials may be adopted. In the case that a multi-layered structure comprising a plurality of layers is adopted as the gas barrier layer, a plurality of layers of inorganic oxides/nitrides as above may be built up on top of one another. Alternatively, with an objective of further improving the flatness of the surface of the gas barrier layer, layer(s) of inorganic oxide(s)/nitride(s) as above and layer(s) of organic material(s) may be built up on top of one another. Organic materials that can be used include, for example, imide-modified silicone resins (see, for example, Japanese Patent Application Laid-open Nos. 5-134112, 7-218717, and No. 7-306311), materials obtained by dispersing an inorganic metal compound ($TiO_2$, $Al_2O_3$, $SiO_2$, etc.) in an acrylic, polyimide or silicone resin (see Japanese Patent Application Laid-open Nos. 5-119306 and 7-104114), UV-curable resins such as epoxy-modified acrylate resins, and acrylate monomer/oligomer/polymer resins containing reactive vinyl groups (see Japanese Patent Application Laid-open No. 7-48424), resist resins (see Japanese Patent Application Laid-open Nos. 8-279394, 6-300910, 7-128519, and 9-330793, inorganic compounds (which may be formed through a sol-gel method; see Japanese Patent Application Laid-open No. 8-27934 and Gekkan Display, 1997, Vol. 3, No. 7), and photocurable and/or heat-curable resins such as fluororesins (see Japanese Patent Application Laid-open Nos. 9-330793 and 5-36475).

When forming a gas barrier layer from material(s) such as the above, a freely chosen method known in the technical field in question may be used, for example a dry method (sputtering, vapor deposition, CVD, etc.) or a wet method (spin coating, roll coating, casting, dip coating, etc.). Moreover, in the case of providing a gas barrier layer, to minimize the viewing angle dependence (changes in the color hue upon changes in the viewing angle), it is preferable for the thickness of the gas barrier layer to be low, this being so long as a sufficient barrier ability against gases (oxygen, water vapor, organic solvent vapors, etc.) can be attained.

A color-converting light-emitting device can be formed by combining a color-converting filter formed using the method of the present invention and a light-emitting part (light source). A freely chosen light source that emits light from the near ultraviolet to visible region, preferably blue or blue/green light, can be used as the light-emitting part. Examples of such a light source include EL light-emitting devices, plasma light-emitting devices, cold cathode tubes, electric discharge lamps (high-pressure or ultra-high-pressure mercury lamps), light-emitting diodes (LEDs), and so on. The light-emitting part is disposed on the side of color-converting layers 4. Alternatively, the light-emitting part may be laminated directly onto the color-converting filter formed using the method of the present invention. In the case of directly laminating on the light-emitting part, it is particularly advantageous that the upper surface of the color-converting filter formed using the method of the present invention is flat.

Figure 4:
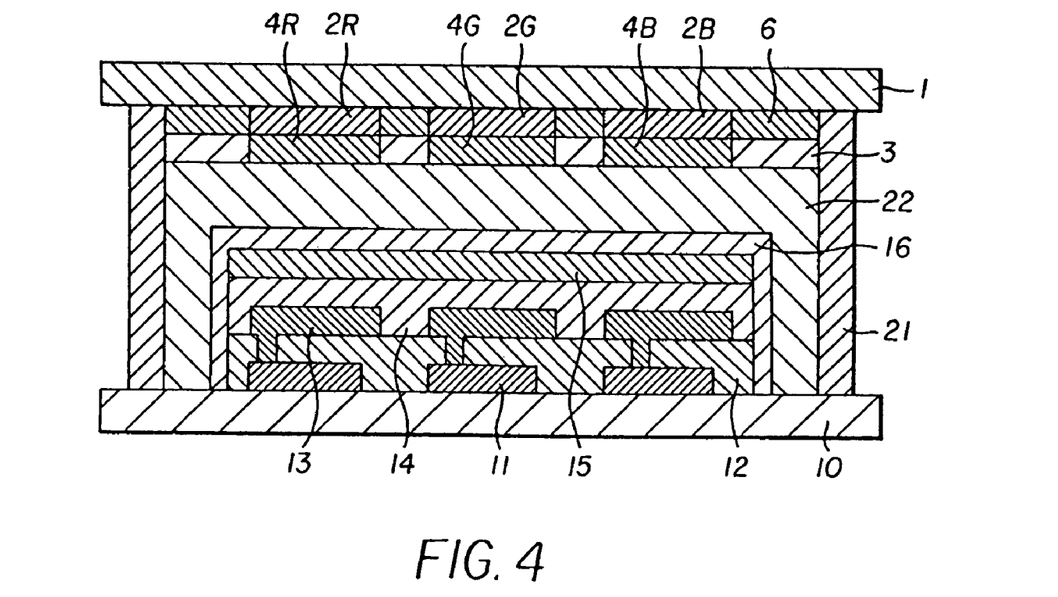
FIG. 4 is a schematic sectional drawing showing an example of a color-converting light-emitting device formed using a color-converting filter manufactured using the method of the present invention.

As an example of a color-converting light-emitting device according to the present invention, FIG. 4 shows a top emission type organic EL display formed by bonding the color-converting filter to an organic EL device. An organic EL device comprises flattening film 12, lower electrode 13, organic EL layer 14, upper electrode 15 and passivation layer 16 formed on substrate 10 on which TFTs 11 have been formed as switching devices in advance. Lower electrode 13 is divided into a plurality of parts, and the parts are reflective electrodes that are connected one-to-one to TFTs 11; upper electrode 15 is a transparent electrode that is formed uniformly over the whole surface. The various layers constituting the organic EL device can be formed using materials and methods known in the technical field in question.

Blue, green and red color filter layers 2B, 2G and 2R, and blue, green and red color-converting layers 4B, 4G and 4R are formed on transparent substrate 1. Moreover, black mask 6 for improving contrast is formed between and around the color filter layers. In the example shown in FIG. 4, colorant layer 3 is thus present as originally formed with none of the colorants therein decomposed in positions corresponding to black mask 6, and functions as a flattening layer in these positions.

Next, the organic EL device and the color-converting filter are aligned and bonded together, with filler layer 22 (a layer that may be provided as desired) being formed therebetween, and then finally peripheral parts are sealed using outer periphery sealing layer (adhesive) 21, whereby the organic EL display is obtained. An active matrix driving type display has been shown in FIG. 4, but a passive matrix driving type organic EL device may of course be used instead.

The above-mentioned organic EL layer 14 emits light from the near ultraviolet to visible region, preferably light in the blue or blue/green region. This emitted light is incident on the color-converting filter layers, and is subjected to wavelength distribution conversion into visible light having the desired colors. Organic EL layer 14 has a structure comprising at least an organic light-emitting layer, and if necessary a hole injection layer, a hole transport layer, an electron transport layer, and/or an electron injection layer are interposed. Specifically, organic EL layer 14 having a layer structure such as the following is adopted.

(1) Organic light-emitting layer
(2) Hole injection layer/organic light-emitting layer
(3) Organic light-emitting layer/electron injection layer
(4) Hole injection layer/organic light-emitting layer/electron injection layer
(5) Hole injection layer/hole transport layer/organic light-emitting layer/electron injection layer
(6) Hole injection layer/hole transport layer/organic light-emitting layer/electron transport layer/electron injection layer In the above, the anode(s) is/are connected to the organic light-emitting layer or the hole injection layer, and the cathode(s) is/are connected to the organic light-emitting layer or the electron injection layer.

Publicly known materials are used as the materials of the above-mentioned layers. To obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used in the organic light-emitting layer. Moreover, a phthalocyanine compound such as copper phthalocyanine, a triphenylamine derivative such as m-MTDATA, or the like can be used as the hole injection layer, and a biphenylamine derivative such as TPD or α-NPD, or the like can be used as the hole transport layer. Moreover, an oxadiazole derivative such as PBD, a triazole derivative, a triazine derivative, or the like can be used as the electron transport layer, and an aluminum quinolinol complex or the like can be used as the electron injection layer. Furthermore, an alkali metal, an alkaline earth metal, or an alloy containing an alkali metal or an alkaline earth metal, or an alkali metal fluoride, or the like may also be used as the electron injection layer.

A color-converting-function-possessing color filter according to the third embodiment of the present invention has a multi-layered structure comprising transparent substrate 1, color filter layers 2 and colorant layer 3, and is also useful as an intermediate product in the method of the first embodiment. In this structure, colorant layer 3 functions as a layer that changes the hue of incident light from light sources. Specifically, the color-converting colorant in colorant layer 3 absorbs light in part of the wavelength region of the incident light, and emits light in a wavelength region different to the wavelength region of absorption, whereby the light in wavelength regions not absorbed by the color-converting colorant and the light emitted by the color-converting colorant are combined, and hence light of a different hue to that entering the colorant layer 3 exits from colorant layer 3. More specifically, if a constitution is adopted in which colorant layer 3 absorbs light in part of the wavelength region of the incident light, and emits light of a complementary color to this wavelength region, then the light exiting colorant layer 3 can be white light. For example, by using blue/green light as the incident light, and converting some of the light in the blue wavelength region into red light using the color-converting colorant, the exiting light can be white.

As transparent substrate 1 and color filter layers 2, ones like those described in the first embodiment can be used. Regarding colorant layer 3 as well, one like that in the first embodiment can be used.

In the case of making the light exiting colorant layer 3 in the present embodiment be white light, the type of the color-converting colorant used, the absorption spectrum thereof, the emission spectrum of the converted light therefrom, and the content thereof, and the thickness of colorant layer 3 can be selected as appropriate, giving consideration to the wavelength distribution of the light emitted by the light sources used. As the color-converting colorant, it is preferable to use a red color-converting colorant as described in the first embodiment. Moreover, although this will depend on the wavelength distribution of the light emitted by the light sources, it is also possible to introduce a green color-converting colorant into colorant layer 3, whereby the blue component of the light source light can be reduced, and at the same time green light emitted by the green color-converting colorant can further be converted by the red color-converting colorant, thus increasing the efficiency of conversion into red light, and hence increasing the red component in the exiting light, whereby white light having a desired wavelength distribution can be obtained. Green color-converting colorants that can be used are as described in the first embodiment.

In the case of making the light emitted from colorant layer 3 be white light, the content(s) of the color-converting colorant(s) in colorant layer 3 and the thickness of colorant layer 3 are adjusted, thus adjusting the amount of reduction of the blue component in the light source light and the amount of increase of the red component in the exiting light, whereby the intensities of the blue, green and red components can be equalized and hence white light can be obtained. Comparing colorant layer 3 with that in the first embodiment, colorant layer 3 in the present embodiment generally has a lower thickness, or has a lower color-converting colorant content, or both of these.

Furthermore, colorant layer 3 in the present invention is formed so as to cover color filter layers 2 of the plurality of types present therebelow, and hence also functions as a protective layer that protects color filter layers 2 from the effects of the surrounding environment (humidity, oxygen, etc.). Moreover, patterning of the colorant layer is not required, and hence the color-converting-function-possessing color filter of the present embodiment is advantageous in terms of the manufacturing process being simplified, and moreover for the same reason as with the first embodiment, is also advantageous in terms of high detail being possible.

In the color-converting-function-possessing color filter of the present invention, a gas barrier layer may be provided such as to cover colorant layer 3. Materials, structures and formation methods that can be used for the gas barrier layer are as described in the first embodiment.

The color-converting-function-possessing color filter of the present embodiment is particularly useful when combined with light sources that can be independently controlled and can be arranged in a highly detailed matrix shape. The light sources are disposed on the side of colorant layer 3. For example, the color-converting-function-possessing color filter can be combined with liquid crystal shutter-possessing light bulbs, EL light emitters, plasma light emitters, light-emitting diodes (LEDs) or the like, and is preferably combined with EL light emitters, particularly preferably organic EL light emitters. In the case of obtaining white light using colorant layer 3, it is preferable to use light sources that emit blue to blue/green light. As in the case of the color-converting filter formed through the method of the first embodiment, it is possible to bond together the color-converting-function-possessing color filter of the present embodiment and organic EL light emitters that have been formed on a separate substrate, thus manufacturing a top emission type organic EL display.

Furthermore, the color-converting-function-possessing color filter of the present embodiment has special advantages as a color filter for display in which pixels are provided in a matrix shape using color filter layers 2 of a plurality of types (2 to 6 types, preferably 3 types, particularly preferably the three types blue, green and red) on transparent substrate 1 (with each pixel being constituted from a plurality of sub-pixels corresponding to the respective colors). In this form, for light emitted by the independently controllable light sources in positions corresponding to the sub-pixels provided in a matrix shape, the hue is changed by colorant layer 3 to produce white light, which enters color filter layers 2 of the sub-pixels. Consequently, unlike the case when color-converting layers are provided corresponding to the colors of the respective sub-pixels, identical light enters each of the color filter layers of the various colors, and hence the necessity of considering the efficiency of color conversion for the color-converting layers of each of the colors when driving the light sources is eliminated, and thus the driving circuitry for the light sources can be simplified, thereby reducing the cost. Furthermore, because each of the light sources arranged in the matrix shape can be driven under identical conditions, the problem of only light sources corresponding to a particular color deteriorating upon prolonged driving can be suppressed, and hence the color tone of the display can be maintained for a prolonged period.

EXAMPLE 1

A blue filter material (Color Mosaic CB-7001 made by Fujifilm Arch Co., Ltd.) was applied using a spin coating method onto transparent glass substrate 1, and patterning was carried out using a photolithography method, thus forming blue color filter layers 2B of thickness 2 μm in a pattern of lines running in a longitudinal direction with a line width of 0.1 mm and a line spacing of 0.33 mm.

A green filter material (Color Mosaic CG-7001 made by Fujifilm Arch Co., Ltd.) was applied using a spin coating method onto the transparent glass substrate 1 on which blue color filter layers 2B had been formed, and then patterning was carried out using a photolithography method, thus forming green color filter layers 2G of thickness 2 μm in a pattern of lines running in the longitudinal direction with a line width of 0.1 mm and a line spacing of 0.33 mm.

A red filter material (Color Mosaic CR-7001 made by Fujifilm Arch Co., Ltd.) was applied using a spin coating method, and then patterning was carried out using a photolithography method, thus forming red color filter layers 2R of thickness 2 µm in a pattern of lines running in the longitudinal direction with a line width of 0.1 mm and a line spacing of 0.33 mm.

A fluorescent color-converting colorant solution was prepared by dissolving Coumarin 6 (0.1 parts by mass), Rhodamine 6G (0.3 parts by mass) and Basic Violet 11 (0.3 parts by mass) in a propylene glycol monoethyl acetate solvent (120 parts by mass). 100 parts by mass of a photopolymerizable resin 'V259PA/P5' (trade name, Nippon Steel Chemical Co., Ltd.) was added to the solution and dissolved, thus obtaining a coating liquid. The coating liquid was applied by a spin coating method, and drying was carried out by heating, thus forming colorant layer 3 of thickness 7 µm. Here, the Coumarin 6 is a green color-converting colorant, and the Rhodamine 6G and the Basic Violet 11 are red color-converting colorants.

Exposure with light was carried out using a carbon arc lamp (white light source) disposed on the side of transparent substrate 1. The intensity of the light at the surface of transparent substrate 1 was 1 W/cm$^2$. Here, samples comprising glass substrate 1 with color filter layers 2 and colorant layer 3 formed thereon were formed separately, and the photodecomposition behavior of the color-converting colorants in the samples was studied; the time taken for the absorption strength of the colorants to drop to 1/10 of the original value was then used as the exposure time in the present example. As a result of the exposure, red color-converting layers 4R containing the Rhodamine 6G and the Basic Violet 11 were formed on red color filter layers 2R, and green color-converting layers 4G containing the Coumarin 6 were formed on green color filter layers 2G. All of the colorants in colorant layer 3 were decomposed in regions above blue color filter layers 2B and in regions where no color filter layer had been provided.

In the color-converting filter obtained, color-converting layers 4R and 4G were formed in the positions of corresponding color filter layers 2R and 2G, and misshaping or the like of the color-converting layers was not observed.

EXAMPLE 2

A black mask material (Color Mosaic CK-7000 made by Fujifilm Arch Co., Ltd.) was applied using a spin coating method onto transparent substrate 1, and then patterning was carried out using a photolithography method, thus obtaining black mask 6 of thickness 1.5 µm having therein a plurality of openings each of size 0.33 mm (longitudinal direction)× 0.09 mm (transverse direction). The spacing between the openings was 0.03 mm in both the longitudinal and transverse directions.

Next, a blue filter material (Color Mosaic CB-7001 made by Fujifilm Arch Co., Ltd.) was applied using a spin coating method, and patterning was carried out using a photolithography method, thus forming blue color filter layers 2B of thickness 2 µm in a pattern of lines running in the longitudinal direction with a line width of 0.1 mm and a line spacing of 0.33 mm.

A green filter material (Color Mosaic CG-7001 made by Fujifilm Arch Co., Ltd.) was applied using a spin coating method onto the transparent substrate 1 on which blue color filter layers 2B had been formed, and then patterning was carried out using a photolithography method, thus forming green color filter layers 2G of thickness 2 µm in a pattern of lines running in the longitudinal direction with a line width of 0.1 mm and a line spacing of 0.33 mm.

A red filter material (Color Mosaic CR-7001 made by Fujifilm Arch Co., Ltd.) was applied using a spin coating method, and then patterning was carried out using a photolithography method, thus forming red color filter layers 2R of thickness 2 µm in a pattern of lines running in the longitudinal direction with a line width of 0.1 mm and a line spacing of 0.33 mm.

A fluorescent color-converting colorant solution was prepared by dissolving Coumarin 6 (0.1 parts by mass), Rhodamine 6G (0.3 parts by mass) and Basic Violet 11 (0.3 parts by mass) in a propylene glycol monoethyl acetate solvent (120 parts by mass). 100 parts by mass of a photopolymerizable resin 'V259PA/P5' (trade name, Nippon Steel Chemical Co., Ltd.) was added to the solution and dissolved, thus obtaining a coating liquid. The coating liquid was applied by a spin coating method, and drying was carried out by heating, thus forming colorant layer 3 of thickness 7 µm. Here, the Coumarin 6 is a green color-converting colorant, and the Rhodamine 6G and the Basic Violet 11 are red color-converting colorants.

Exposure with light was carried out using a carbon arc lamp (white light source) disposed on the side of transparent substrate 1. The intensity of the light at the surface of the transparent substrate 1 was 1 W/cm$^2$. Here, samples comprising a glass substrate 1 with color filter layers 2 and colorant layer 3 formed thereon were formed separately, and the photodecomposition behavior of the color-converting colorants in the samples was studied; the time taken for the absorption strength of the colorants to drop to 1/10 of the original value was then used as the exposure time in the present example. As a result of the exposure, red color-converting layers 4R containing the Rhodamine 6G and the Basic Violet 11 were formed on red color filter layers 2R, and green color-converting layers 4G containing the Coumarin 6 were formed on green color filter layers 2G. All of the colorants were decomposed in layers 4B above blue color filter layers 2B.

In the color-converting filter obtained, pixels having dimensions of 0.36 mm×0.36 mm including the black mask were arranged in a matrix, with each pixel being constituted from red, green and blue sub-pixels each of dimensions 0.33 mm (longitudinal direction)×0.09 mm (transverse direction).

Al to a thickness of 500 nm and IZO to a thickness of 100 nm were formed by sputtering using a mask on glass substrate 10 on which TFTs 11 and insulating flattening film 12 having therein an opening at a source electrode part for each of the TFTs had been provided in advance, thus forming first electrode 13 divided into a plurality of parts corresponding one-to-one to TFTs 11. The parts of first electrode 13 each had dimensions of 0.33 mm (longitudinal direction)×0.09 mm (transverse direction), and were arranged in a matrix with a spacing of 0.03 mm in both the longitudinal and transverse directions.

The substrate on which first electrode 13 had been formed was installed in a resistive heating vapor deposition apparatus, and organic EL layer 14 was formed. Organic EL layer 14 had a four-layer structure comprising a hole injection layer, a hole transport layer, an organic light-emitting layer, and an electron injection layer. Specifically, to form organic EL layer 14, the pressure inside the vacuum chamber was reduced down to 1×10$^{-4}$ Pa, and without releasing the vacuum, copper phthalocyanine (CuPc, hole injection layer) was formed to a thickness of 100 nm, 4,4'-bis[N-(1-naphthyl)-N-phenylamino]biphenyl (α-NPD, hole transport layer) was formed to a thickness of 20 nm, 4,4'-bis(2,2'-diphenylvinyl)biphenyl (DPVBi, organic light-emitting layer) was formed to a thickness of 30 nm, and aluminum tris(8-quinolinolate) (Alq, electron injection layer) was formed to a thickness of 20 nm, thus obtaining the organic EL layer 14. Without releasing the vacuum, Mg/Ag (mass ratio 10:1) to a thickness of 10 nm and IZO to a thickness of 10 nm were then deposited, thus forming second electrode 15. Finally, a passivation layer made of $SiO_2$ was formed to a thickness of 500 μm so as to cover the structure from second electrode 15 down, thus obtaining an organic EL light emitter.

Next, the color-converting filter was conveyed to a glove box in which the moisture concentration and the oxygen concentration were both controlled to 1 ppm. An ultraviolet curing type adhesive (made by Three Bond, trade name 30Y-437) having beads of diameter 20 μm dispersed therein was then applied as outer periphery sealing layer 21 onto outer peripheral parts of transparent substrate 1 of the color-converting filter using a dispenser robot. The color-converting filter and the organic EL light emitter were then bonded together while carrying out alignment, thus forming an assembly. Irradiation with 100 mW/cm$^2$ of ultraviolet radiation was then carried out for 30 seconds using a UV lamp, thus curing outer periphery sealing layer 21 and obtaining an EL display.

EXAMPLE 3

The present example is for illustrating the effects of colorant layer 3 used in the third embodiment of the present invention. Amounts of 0.05 g of Coumarin 6 and 0.04 g of Rhodamine B were added to 25 g of a photoresist V259PAP5 (made by Nippon Steel Chemical Co., Ltd.), thus obtaining a coating liquid. The coating liquid was applied to the surface of a transparent substrate (a 1737 glass substrate made by Corning), thus obtaining a colorant layer of thickness 2 μm.

Next, using a sputtering method, a gas barrier layer comprising an $SiO_2$ film of thickness 0.5 μm was formed such as to cover the colorant layer, thus obtaining a colorant layer substrate. An RF planar magnetron type apparatus was used as the sputtering apparatus, $SiO_2$ was used as the target, and Ar was used as the sputtering gas. The substrate temperature during the $SiO_2$ film formation was set to 80° C.

An anode (a multi-layered body of Al of thickness 500 nm and ITO of thickness 100 nm), an organic EL layer, and a cathode (a multi-layered body of Mg/Ag (mass ratio 10:1) of thickness 10 nm and ITO of thickness 10 nm) were formed on a separate substrate, thus obtaining an organic EL device. The organic EL layer had a multi-layered structure comprising CuPc of thickness 100 nm, α-NPD of thickness 20 nm, DPVBi of thickness 30 nm, and Alq of thickness 20 nm in this order from the anode. The organic EL device obtained emitted blue/green light in the CIE XYZ coordinate system.

The colorant layer substrate and the organic EL device obtained as described above were disposed such that the gas barrier layer and the transparent anode faced one another, and the organic EL device was made to emit light. The light exiting after passing through the colorant layer had chromaticity values (x,y)=(0.30,0.33), and had a broad wavelength distribution in the visible region.

EXAMPLE 4

Color filter layers and a black mask were formed on a transparent substrate (a 1737 glass substrate made by Corning) through a photolithography method using a black mask material (Color Mosaic CK-7000 made by Fujifilm Arch Co., Ltd.), a blue filter material (Color Mosaic CB-7001 made by Fujifilm Arch Co., Ltd.), a green filter material, and a red filter material (Color Mosaic CR-7001 made by Fujifilm Arch Co., Ltd.).

Here, the dimensions of each of the sub-pixels were 300 μm×100 μm, the gap between adjacent sub-pixels (i.e. the region in which the black mask was formed) was 30 μm in the longitudinal direction and 10 μm in the transverse direction, and the sub-pixels were arranged such that each group of blue, green and red sub-pixels formed one pixel. Moreover, the total number of pixels was 2500, with 50 pixels being arranged in the longitudinal direction and 50 pixels in the transverse direction. The thickness of the color filters was 1 μm for the blue and red ones, and 2 μm for the green ones.

Next, 0.05 g of Coumarin 6 and 0.04 g of Rhodamine B were added to 25 g of a photoresist V259PAP5 (made by Nippon Steel Chemical Co., Ltd.), thus obtaining a coating liquid. The coating liquid was applied to the surface of the color filter layers and the black mask, thus obtaining a colorant layer of thickness 2 μm.

Next, using a sputtering method, a gas barrier layer comprising a $SiO_2$ film of thickness 0.5 μm was formed such as to cover the colorant layer, thus obtaining a color-converting-function-possessing color filter. An RF planar magnetron type apparatus was used as the sputtering apparatus, $SiO_2$ was used as the target, and Ar was used as the sputtering gas. The substrate temperature during the $SiO_2$ film formation was set to 80° C.

Using a sputtering method and a photolithography method, first electrodes (reflective anodes) comprising Al of thickness 500 nm and ITO of thickness 100 nm were formed on a separate glass substrate. The first electrodes had a pattern of stripes running in the longitudinal direction, with the width of each stripe being 105 μm, and were arranged such that the pitch was 110 μm (i.e. with a spacing of 5 μm between adjacent stripes).

Next, the substrate on which the first electrodes had been formed was installed in a resistive heating vapor deposition apparatus, and with the pressure inside the vacuum chamber at 10$^{-4}$ Pa, CuPc was formed to a thickness of 100 nm as a hole injection layer, α-NPD was formed to a thickness of 20 nm as a hole transport layer, DPVBi was formed to a thickness of 30 nm as a light-emitting layer, and Alq was formed to a thickness of 20 nm as an electron injection layer, thus forming an organic EL layer.

Then, using a mask, second electrodes comprising Mg/Ag (mass ratio 10:1) of thickness 10 nm and ITO of thickness 10 nm were built formed on the organic EL layer. The second electrodes had a pattern of stripes running in the transverse direction, with the width of each stripe being 300 μm, and were arranged such that the pitch was 330 μm (i.e., with a spacing of 30 μm between adjacent stripes). Finally, a passivation layer made of $SiO_2$ was formed to a thickness of 500 nm so as to cover the structure from the second electrodes down, thus obtaining an organic EL light emitter.

Next, the color-converting-function-possessing color filter and the organic EL light emitter were conveyed to a glove box in which the moisture concentration and the oxygen concentration were both controlled to 1 ppm. A UV-curable adhesive (made by Three Bond, trade name 30Y-437) having beads of diameter 20 μm dispersed therein was then applied as an outer periphery sealing layer onto outer peripheral parts of the transparent substrate of the color-converting-function-possessing color filter using a dispenser robot. The color-converting-function-possessing color filter and the organic EL light emitter were then bonded together while carrying out alignment, thus forming an assembly. Irradiation with 100 mW/cm$^2$ of ultraviolet radiation was then carried out for 30 seconds, thus curing the outer periphery sealing layer and obtaining an organic EL display.

The light emission characteristics of the organic EL display manufactured as described above were measured. Specifically, the chromaticity values in the case of lighting all of the pixels (W), and the chromaticity values and the brightness ratio (the relative value taking the case of lighting all of the pixels as 100) in the case of lighting only the sub-pixels corresponding to each of the colors (R, G, B) were measured. The results are shown in Table 1.

TABLE 1

Brightness ratio and chromaticity values for organic EL display using color-converting-function-possessing color filter

|   | Brightness ratio | CIE-x | CIE-y |
|---|---|---|---|
| W | 100 | 0.32 | 0.30 |
| R | 26 | 0.62 | 0.36 |
| G | 36 | 0.25 | 0.63 |
| B | 38 | 0.12 | 0.23 |

Thus, a color-converting-function-possessing color filter has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A color-converting-function-possessing color filter, comprising:
   a transparent substrate;
   color filter layers of n types formed on said transparent substrate, wherein n represents an integer from 2 to 6; and
   a colorant layer containing at least one color-converting colorant formed integrally with and covering said color filter layers of the n types, said colorant layer being self-aligned with said color filter layers by means of exposure through said transparent substrate and said color filter layers;
   wherein said at least one color-converting colorant
   (i) absorbs light in part of the wavelength region of incident light, and emits light in a wavelength region different to the wavelength region of absorption,
   (ii) is decomposed by light transmitted by transparent substrate, but is not decomposed by light transmitted by color filter layers, and
   (iii) does not produce colored decomposition products when it is decomposed by light.

2. The color-converting-function-possessing color filter according to claim 1, wherein said colorant layer also functions as a protective layer for said color filter layers.

3. The color-converting-function-possessing color filter according to claim 1, wherein the incident light incident on said colorant layer is blue to blue/green light, and said at least one color-converting colorant emits red light.

4. The color-converting-function-possessing color filter according to claim 1, wherein light exiting said colorant layer is white light.

5. The color-converting-function-possessing color filter according to claim 1, wherein in said colorant layer, said at least one color-converting colorant is dispersed in a resin.

6. The color-converting-function-possessing color filter according to claim 1, further comprising a gas barrier layer covering said colorant layer.

* * * * *

UNITED STATES PATENT AND TRADEMARK OFFICE
CERTIFICATE OF CORRECTION

| | | |
|---|---|---|
| PATENT NO. | : 7,294,439 B2 | Page 1 of 1 |
| APPLICATION NO. | : 10/930453 | |
| DATED | : November 13, 2007 | |
| INVENTOR(S) | : Kawaguchi et al. | |

It is certified that error appears in the above-identified patent and that said Letters Patent is hereby corrected as shown below:

On The Title Page, Item (73)

Please delete "(KP)" and insert --(JP)--

Signed and Sealed this

Eighteenth Day of March, 2008

JON W. DUDAS
*Director of the United States Patent and Trademark Office*